United States Patent [19]

Shin

[11] Patent Number: 4,965,470
[45] Date of Patent: Oct. 23, 1990

[54] HIGH INTEGRATED BI-CMOS LOGIC CIRCUIT

[75] Inventor: Yunseung Shin, Sungnam, Rep. of Korea

[73] Assignee: Samsung Electronics Co., Ltd., Rep. of Korea

[21] Appl. No.: 303,183

[22] Filed: Jan. 30, 1989

[51] Int. Cl.⁵ .................. H03K 19/02; H03K 19/20
[52] U.S. Cl. .................... 307/446; 307/445; 307/570
[58] Field of Search ........... 307/443, 445, 446, 448, 307/451, 570

[56] References Cited

U.S. PATENT DOCUMENTS

| | | | |
|---|---|---|---|
| 4,616,146 | 10/1986 | Lee et al. | 307/570 |
| 4,682,054 | 7/1987 | McLaughlin | 307/446 |
| 4,694,203 | 9/1987 | Uragami et al. | 307/446 |
| 4,804,869 | 2/1989 | Masuda et al. | 307/446 |

FOREIGN PATENT DOCUMENTS 0099100  7/1983  European Pat. Off. ............ 307/446

Primary Examiner—Stanley D. Miller
Assistant Examiner—M. Wambach
Attorney, Agent, or Firm—Cushman, Darby & Cushman

[57] ABSTRACT

A highly integrated Bi-CMOS logic circuit using MOS transistors and Bipolar transistors, the circuit including a number of input terminals for inputting signals, an equal number of MOS transistors having drain-source current paths connected in series and each having a gate controlled by a corresponding one of the input signals, and an equal number of MOS transistors having drain-source current paths connected in parallel and each having a gate controlled by a corresponding one of the input signals. Two bipolar transistors are base-controlled by the MOS transistors.

4 Claims, 4 Drawing Sheets

HIGH INTEGRATED BI-CMOS LOGIC CIRCUIT

BACKGROUND OF THE INVENTION

1. Field of the Invention

The present invention relates to a high integrated Bi-CMOS logic circuit using bipolar transistors and MOS transistors to perform a logic operation, and more specifically to a Bi-CMOS logic circuit configured as a NOR gate and NAND gate.

2. Description of the Prior Art

In general, the widely known logic symbol and truth table of NOR gate and NAND gate are as illustrated in FIG. 1. FIGS. 1 (a) and (b) show NOR gates having two and three input terminals, respectively. FIGS. 1 (c) and (d) show NAND gates having two and three input terminals, respectively.

As shown by the truth tables of FIG. 1, a NOR gate outputs high level(1) only when all the input signals are low level(0) regardless of the number of input terminals. A NAND gate outputs low level(0) only when all the input signals are high level(1) regardless of the number of input terminals.

In other words, a multi-input NOR gate outputs a low level(0) signal when at least one of input signals is high level(1), and a multi-input NAND gate outputs a high level(1) signal when at least one of input signals is low level(0).

In the past, we have constructed the logic gate of FIGS. 1 (a)-(d) using circuits as shown in FIGS. 2 (a)-(d). But there was a problem in that the circuit structures of the NOR gate and NAND gate of FIG. 2 were complicated. That is, if there were a number N input terminals in the prior art NOR gate and NAND gate, 3N+1 MOS transistors and two bipolar transistors were necessary in order to construct the corresponding circuit.

Thus in the past, the greater the number of NOR gate and NAND gate input terminals, the more complicated the circuit became. There resulted a problem in that the chip area became large to accommodate numerous transistors, and the wiring of the logic circuit became complicated.

SUMMARY OF THE INVENTION

The present invention is devised to improve the former problems. Accordingly, it is an object of the invention to provide high integrated Bi-CMOS logic circuit to reduce the number of MOS transistors required to build a multi-input NOR and NAND gate.

It is another object of the invention to provide a Multi-input NOR gate and NAND gate having a number N input terminals, with Multi-input NOR gate and NAND gate with 2N MOS transistors, and two bipolar transistors in the logic circuit of the present invention.

BRIEF DESCRIPTION OF THE DRAWINGS

These and other objects and advantages of the present invention will become clear from the following description with reference to the accompanying drawings, wherein.

DETAILED DESCRIPTION OF THE INVENTION

Figure 1A:
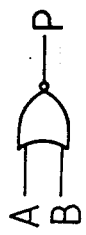
FIGS. 1 a–d are the logic symbols and truth tables of a two and three input terminal NOR gate and NAND gate of FIG. 1.
Figure 1B:
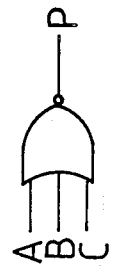

Referring to the circuit diagram shown in the present invention of FIG. 3, we describe the present invention in detail.

The labels used to describe the drawing represent the following:

A,B,C. . . logic gate input terminals
P. . . logic gate output terminal
T1-T20 . . .MOS transistor
Q1-Q8. . .Bipolar transistors;

The circuit of the present invention is largely divided into three parts.

The first part is a first group of MOS transistors equal in number to the number of input terminals. The second part is a second group of MOS transistors equal in number to the number of input terminals. The third part is an output part comprising two complementary bipolar transistors.

Figure 3C:
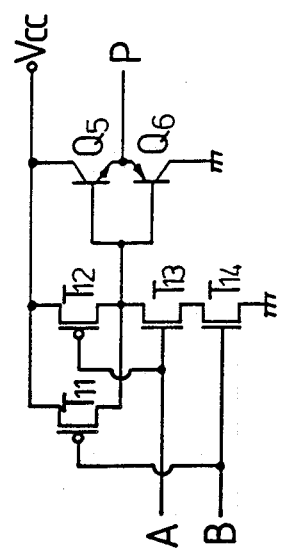
FIGS. 3 a–d are the NOR gate and NAND gate circuit diagrams of the present invention.
Figure 3D:
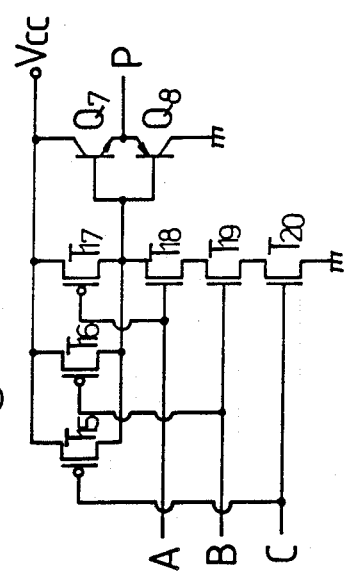
Figure 3A:
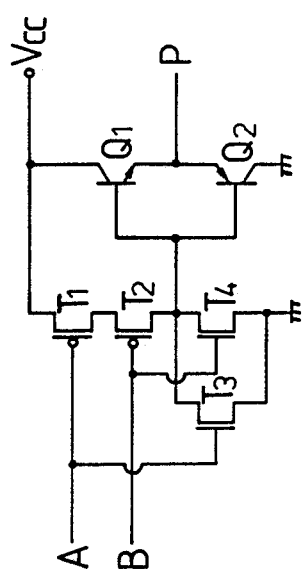
Figure 3B:
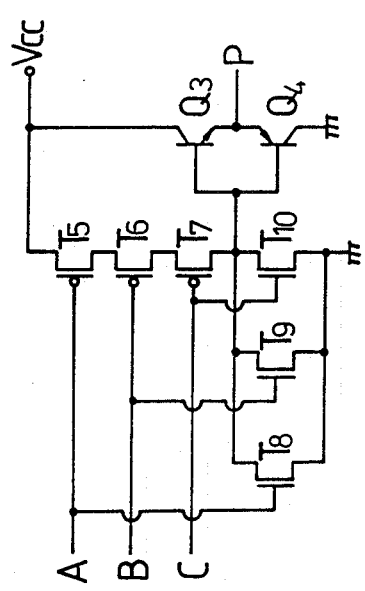

As FIG. 3(a) is two-input NOR gate circuit according to the present invention. It consists of a first group of MOS transistors (T1,T2) having drain-to-source current paths connected in series with each other, a second group of MOS transistors (T3,T4) having drain-to-source current paths connected in parallel with each other, and output transistors (Q1,Q2) which form a complementary bipolar transistor pair.

The first group of transistors (T1,T2) are connected between a first supply voltage terminal shown as VCC, and an intermediate node. The second group of transistors (T3,T4) are connected between a second supply voltage terminal shown as ground, and the intermediate node. The intermediate node drives the bases of output transistors (Q1,Q2).

When the second transistors (T1,T2) are turned on by input signal(A,B) a high level signal is applied to output transistors (Q1,Q2), and if at least one of said transistors(T3,T4) is in an on state due to input signal(A,B), a low level signal is applied to the output transistors(Q1,Q2). The output transistors(Q1,Q2) are complementary type bipolar transistors having their emitter-to-collector current paths connected in series between the first supply voltage terminal (VCC) and second supply voltage terminal (Ground).

The intermediate node is driven by transistors (T1,T2) and by transistors (T3,T4), and is input to the bases of output transistors (Q1,Q2).

There follows an explanation of the operation of the two-input NOR gate circuit as shown in FIG. 3(a).

If input terminal (A,B) are held at a low level, MOS transistors(T1,T2) are all on and MOS transistors (T3,T4) are all off. Thus, a first supply voltage (commonly a high level signal) is inputted to the base of bipolar transistors (Q1,Q2) through MOS transistors (T1,T2).

Given the above, transistor(Q1) is on and transistor(Q2) is off, so the output signal taken from an output terminal (P) is outputted as high level.

If at least one high level signal is inputted to input terminals(A,B), at least one of transistors(T1,T2) is off, and at least one of transistors(T3,T4) is on. Therefore a low level signal is inputted to the bases of bipolar output transistors(Q1,Q2). Accordingly, transistor(Q1) is off, transistor(Q2) is on, and an output signal taken from the output terminal (P) is outputted as low level.

The two-input NOR gate described in FIG. 3(a) satisfies the truth table of FIG. 1(a) by the operation described above, and the three-input NOR gate of FIG. 3(b) (or a Multi-input NOR gate with multiple input terminals numbering more than three) is also operated by the same logic operation of the described two-input NOR gate.

FIG. 3(c) is a two-input NAND gate according to the present invention. An explanation of the operation follows:

If input terminals (A,B) are held at a high level, MOS transistors(T11,T12) are off and MOS transistors(T13,T14) are all on. Thus a low level signal is applied to the bases of bipolar output transistors (Q5,Q6). Therefore, transistor (Q5) is off and transistor (Q6) is on, so an output signal taken from output terminal (P) is outputted as a low level.

If at least one low level signal is applied to input terminals(A,B), then at least one of MOS transistors(T11,T12) is on, and at least one of MOS transistors(T13,T14) is off. Therefore, a high level signal is applied to bipolar output transistors(Q5,Q6).

Thus, transistor(Q5) is on and transistor(Q6) is off, so an output signal taken from output terminal (P),(P) is outputted as high level.

Figure 1C:
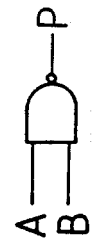
Figure 1D:
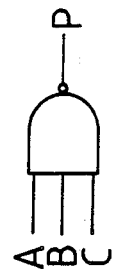
Figure 2C:
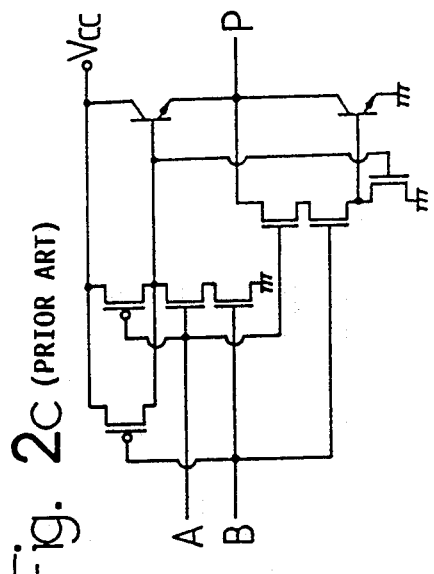
FIGS. 2 a–d are the prior art circuit diagrams of the NOR gate and NAND gate.
Figure 2D:
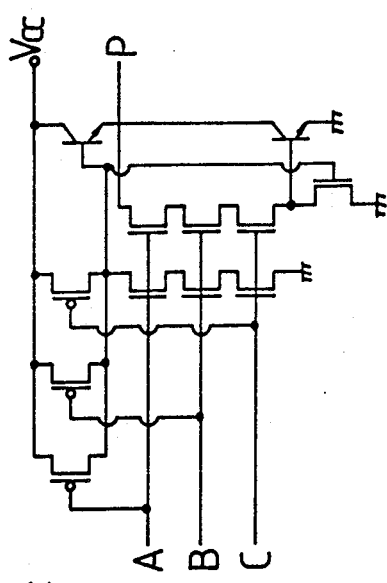
Figure 2A:
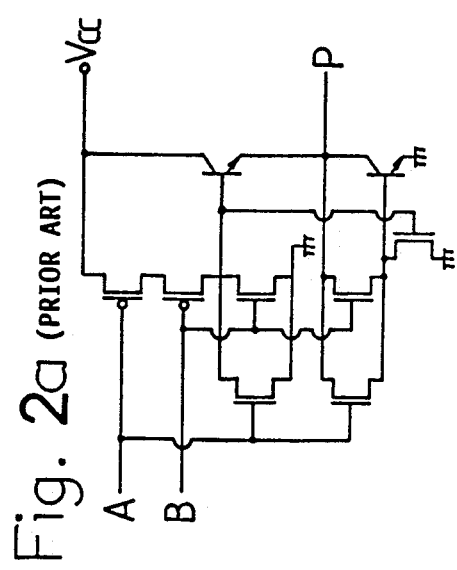
Figure 2B:
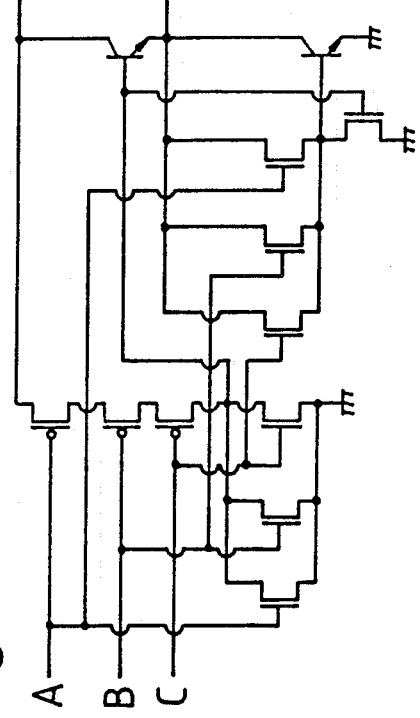

The two-input NAND according to the present invention satisfies the truth table of FIG. 1(c) by the operation described above, and the three-input NAND gate of FIG. 3(d) (or Multi-input NAND gate with multiple input terminals numbering more than three) is also operated by the same logic operation as the described two input NAND gate.

Figure 4:
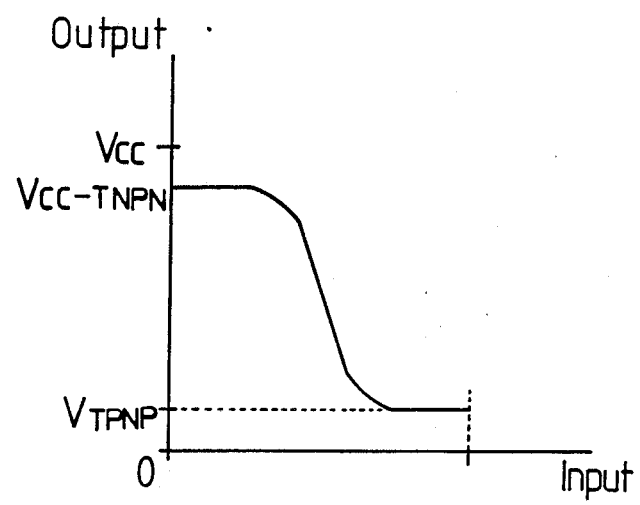
FIG. 4 is the characteristic diagram of the logic circuit of the present invention.

FIG. 4 is a characteristic diagram of the logic circuit of the present invention showing the input-output curve of the bipolar output transistors taken from the output terminal.

The input signal to the bipolar output transistors (taken at the intermediate node) has a full voltage swing between 0.0 V and Vcc, and consequently the final output taken at output terminal (P) swings between a voltage determined by Vcc minus the turn on voltage ($V_{TNPN}$, $V_{TPNP}$) of NPN, PNP output transistors.

That is, the final output taken from output terminal (P) swings between $V_{TPNP}$ and Vcc-$V_{TNPN}$.

By using a logic circuit according to the present invention we can build NOR gates and NAND gates composed with Bi-CMOS, we can simplify the circuit compared with the previous circuits. Therefore it is possible to shrink the area of chip and reduce the manufacturing time.

What is claimed is:

1. A high integrated Bi-CMOS logic circuit comprising:
    a plurality of input terminals;
    a first plurality of MOS transistors having drain-source current paths connected in series between a first supply voltage terminal and an intermediate node, said first MOS transistors each having a gate connected to a corresponding one of said input terminals;
    a second plurality of MOS transistors having drain-source current paths connected in parallel between said intermediate node and a second supply voltage terminal, said second MOS transistor each having a gate connected to a corresponding one of said input terminals;
    a first bipolar transistor having an emitter-collector current path connected between the first supply voltage terminal and an output terminal; and
    a second bipolar transistor having an emitter-collector current path connected between the second supply voltage terminal and said output terminal, said first and second bipolar transistors each having a base connected to said intermediate node.

2. A high integrated Bi-CMOS logic circuit as claimed in claim 1, wherein the first supply voltage terminal is further connected to a source of electric power and the second supply voltage terminal is connected to a ground, the logic circuit thereby operating as a NOR gate.

3. A high integrated Bi-C MOS logic circuit as claimed in claim 1, wherein the first supply voltage terminal is further connected to a ground and the second supply voltage terminal is connected to a source of electric power, the logic circuit thereby operating as a NAND gate.

4. A high integrated Bi-CMOS logic circuit as claimed in claim 1, wherein said first and second bipolar transistors are complementary.

* * * * *